United States Patent [19]

Lo et al.

[11] 3,995,280
[45] Nov. 30, 1976

[54] METHOD OF MONITORING THERMOPLASTIC RECORDING

[75] Inventors: David S. Lo, Burnsville; Leslie H. Johnson, St. Paul; Roger W. Honebrink, Chaska, all of Minn.

[73] Assignee: Sperry Rand Corporation, New York, N.Y.

[22] Filed: Jan. 2, 1975

[21] Appl. No.: 537,889

[52] U.S. Cl. .............................................. 346/77 E
[51] Int. Cl.² ........................................ G01D 15/02
[58] Field of Search ..................... 346/77 E, 74 TP; 340/173 TP

[56] References Cited
UNITED STATES PATENTS

| | | | |
|---|---|---|---|
| 3,131,019 | 4/1964 | D'Antonio | 346/77 E |
| 3,427,628 | 2/1969 | Clunis | 346/77 E X |
| 3,821,722 | 6/1974 | Ost | 346/77 E X |

*Primary Examiner*—George H. Miller, Jr.
*Attorney, Agent, or Firm*—Kenneth T. Grace; Thomas J. Nikolai; Marshall M. Truex

[57] ABSTRACT

A method of and an apparatus for achieving consistent recording or writing of optical data in thermoplastic films is disclosed. An empirically determined level of developing energy E is set into a heat controller that applies developing energy E (heat) to the thermoplastic film that had been previously subjected to an electrostatic charge and an optical signal (light). The monitored frost intensity $F_m$ is then compared to an empirically determined desired frost intensity $F_d$. If $F_m \neq F_d$ the developing energy E that is to be applied to the thermoplastic film is adjusted accordingly in preparation for the next writing operation. Control of the writing process is through control of the developing energy E that is applied to the thermoplastic film with all other developing parameters held relatively constant.

4 Claims, 8 Drawing Figures

METHOD OF MONITORING THERMOPLASTIC RECORDING

BACKGROUND OF THE INVENTION

In the prior art, it is known that optical information may be recorded or written in a thermoplastic film by controlling the three parameters of the surface charge density, the light intensity and the temperature of the thermoplastic film - see the A. E. Jvirblis, et al, U.S. Pat. No. 3,795,514. More recently, work has indicated that holographic recording on thermoplastic films may be the basis of future high-density holographic storage of analog and digital data. See the publications "Holographic Recording on Thermoplastic Films," T. C. Lee, Applied Optics, Vol. 13, No. 4, April, 1974, pp. 888–895, and "An Experimental Read-Write Holographic Memory," W. C. Stewart, et al, RCA Review, Vol. 34, March, 1973, pp. 3–44.

In the prior art of optical recording in thermoplastic films, a major problem that has been encountered has been the inconsistency of the recording process, i.e., for a given optical signal that is to be recorded, the resulting signal intensity that is obtained from the recorded optical signal varies significantly with each individual recording operation and with time. That is, the thermoplastic film appears to exhibit a material fatigue effect after many, e.g., 1,000, record-erase cycles such that signal intensity not only varies between individual recording operations, because of variations of recording parameters, but also varies after many recording operations because of variation of recording material characteristics. The present invention provides a method of and an apparatus for ensuring that the recording operation may be controlled to provide consistent signal intensity between successive recording operations and after many recording operations.

SUMMARY OF THE INVENTION

The present invention includes a recording or writing step that involves subjecting a thermoplastic film to an electrostatic charge, to a standard optical signal (light) that is to be recorded or written therein, and, subsequently, a predetermined increment of developing energy (heat). Next, a monitoring step involves monitoring both the frost intensity $F_m$ and the signal intensity $S_m$ and plotting both frost intensity $F_m$ and the signal intensity $S_m$ versus the corresponding predetermined increment of developing energy. Prior to the writing step, an erasing step erases any priorly recorded signal by the application of an increment of developing energy that is substantially greater than that used during the writing step. These erase, write, monitor, erase, etc., cycles are repeated for predetermined incrementally increasing amounts of developing energy to establish the fixed relationship of the signal intensity/frost intensity curves. From recording system parameters the desired signal intensity $S_d$ is determined and from the previously developed curves the related desired frost intensity $F_d$ and, accordingly, the associated developing energy $E_d$ are obtained.

The developing energy $E_d$ is then inserted in a heat controller and the desired frost intensity $F_d$ is inserted into a comparator. During subsequent erase/write/monitor cycles the monitored frost intensity $F_m$ is compared to the desired frost intensity $F_d$ and if $F_m \neq F_d$ the developing energy $E_d$ previously set into the heat controller is adjusted accordingly to provide on the next erase/write/monitor cycle $F_m = F_d$. Thus, control of the writing process is through control of the developing energy or heat that is applied to the thermoplastic film, all other developing parameters being held relatively constant.

DESCRIPTION OF THE PREFERRED EMBODIMENTS

Figure 1:
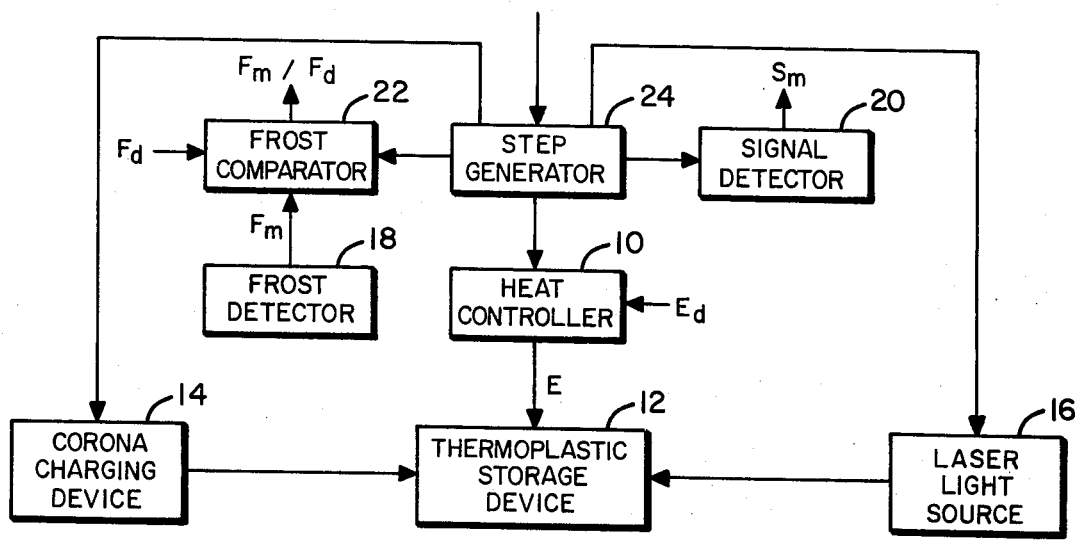
FIG. 1 is a block diagram of a system for cycling an optically-recording thermoplastic film sample according to the present invention.

With particular reference to FIG. 1 there is provided a block diagram of a system for cycling an optically-recording thermoplastic film sample according to the present invention. Using FIG. 2 as an illustration of a typical timing diagram of the erase/write/monitor/read cycle employed by the present invention, heat controller 10 prepares the thermoplastic film 12 for the writing operation by erasing any previously written information therefrom. This erasing step consists of applying to thermoplastic film 12 an increment of developing energy E that is substantially greater than that used during the writing step. Next, the writing step consists of charging device 14 subjecting thermoplastic film 12 to a static electrical charge; then, laser light source 16 subjects thermoplastic film 12 to the optical signal that is to be recorded therein while heat controller 10 then subjects thermoplastic film 12 to a predetermined increment of developing energy E. After the completion of the writing step, laser light source 16 subjects thermoplastic film 12 to the reference beam which reconstructs the signal recorded therein while, concurrently, frost detector 18 and signal detector 20 detect the monitored frost intensity $F_m$ and the monitored signal intensity $S_m$, respectively. The monitored frost intensity $F_m$ is, in turn, coupled to frost comparator 22 which compares the monitored frost intensity $F_m$ to a previously determined desired frost intensity $F_d$, generating a signal that indicates that the monitored frost intensity $F_m$ is within or without a previously determined range determined by the desired frost intensity $F_d$. If the monitored frost intensity $F_m$ is within the predetermined limits, heat controller 10 during the next writing cycle subjects thermoplastic film 12 to the same level or increment of developing energy E. However, if the monitored frost intensity $F_m$ is without the previously determined range as determined by frost comparator 22, heat controller 10 is caused to vary, e.g., increase, the level or increment of developing energy E to which thermoplastic film 12 will be subjected on the next writing cycle so as to bring the monitored frost intensity $F_m$ back within the predetermined range as determined by frost comparator 22.

Figure 3:
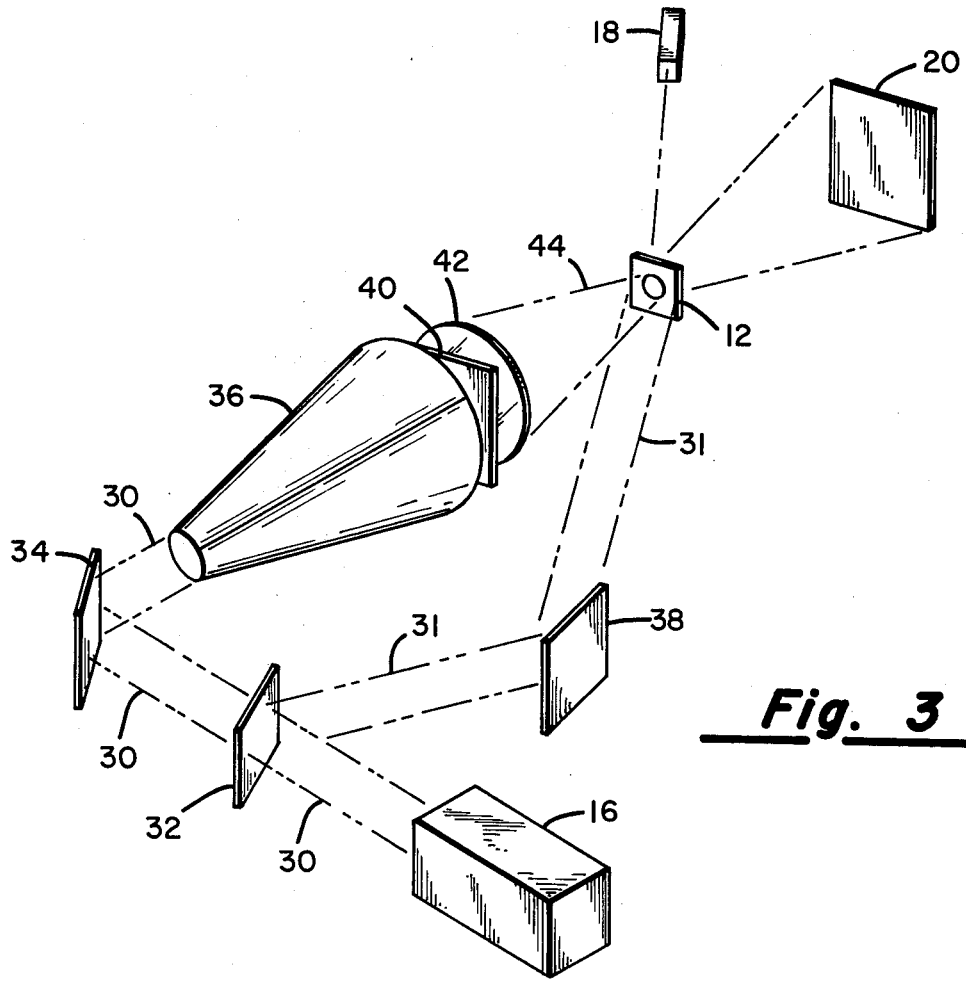
FIG. 3 is a diagrammatic illustration of an optical system for monitoring the signal intensity $S_m$ and the frost intensity $F_m$ of a thermoplastic film sample when cycled by the system of FIG. 1.

With particular reference to FIG. 3 there is presented a diagrammatic illustration of an optical system for monitoring the signal intensity $S_m$ and the frost intensity $F_m$ of a thermoplastic film 12 when cycled by the system of FIG. 1. In this configuration laser light source 16 provides a primary beam 30 of collimated light which impinges upon beam splitter 32 permitting a portion of the primary beam 30 to pass therethrough, to impinge upon mirror 34 and to be focused upon beam expander 36. Beam splitter 32 also generates a reference beam 31 which upon impinging upon mirror 38 is focused upon thermoplastic film 12. Beam expander 36 expands light beam 30 to encompass page composer 40 which contains the information that is to be written into thermoplastic film 12. Lens 42 then focuses the information bearing beam 44 upon a predetermined area of thermoplastic film 12. Signal detector 20 is oriented along the optical axis of the information beam 44 on the far side of thermoplastic film 12 while frost detector 18 is oriented outside of the area of the signal bearing beam 44 to detect only the diffused light that is generated by the frost pattern on thermoplastic film 12.

Figure 4:
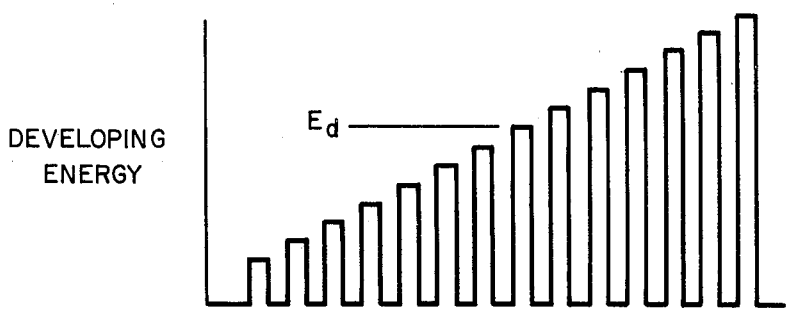
FIG. 4 is a timing diagram of the incremental variation in the developing energy E employed by the present invention to develop the curves of FIG. 5.
Figure 5:
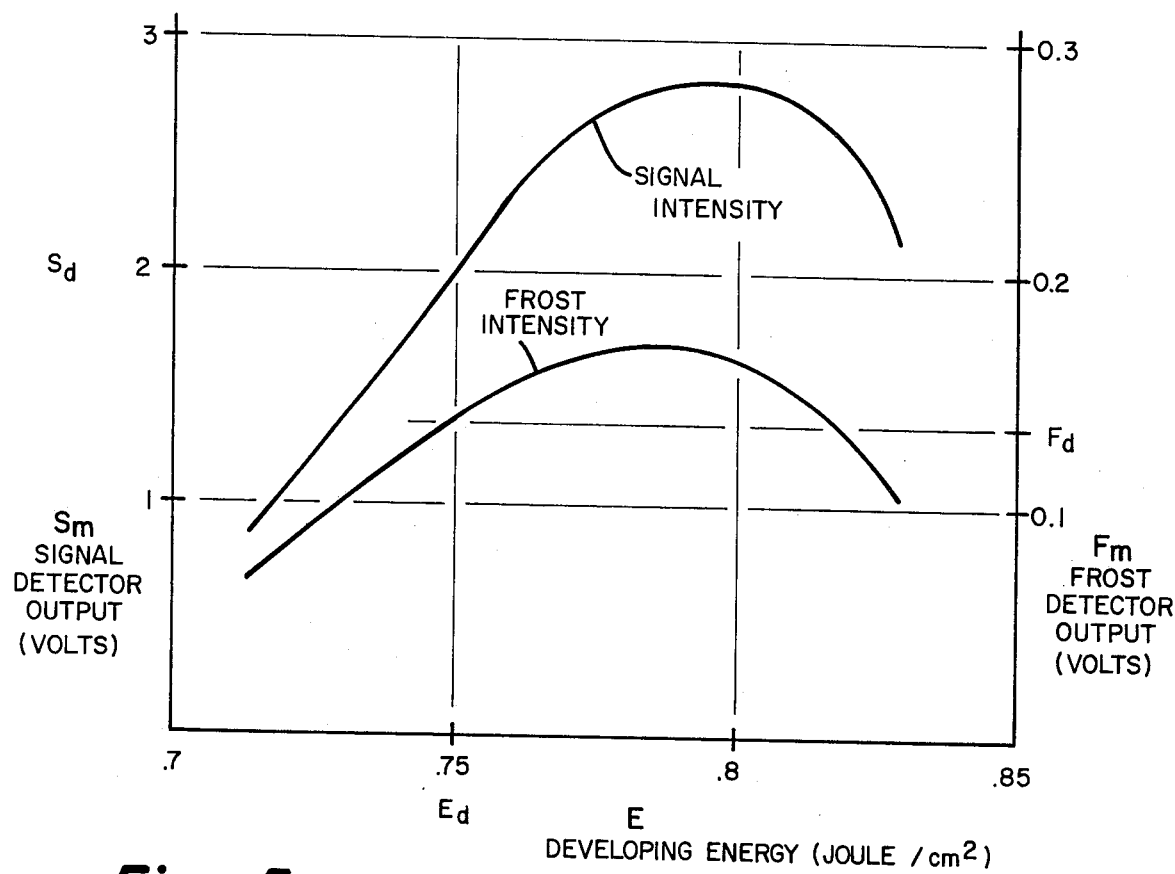
FIG. 5 is a plot of the curves of monitored signal intensity $S_m$ and monitored frost intensity $F_m$ versus developing energy E as obtained from the systems of FIGS. 1, 2 while using the timing diagram of FIG. 4.

The method of the present invention involves an initial erasing step which erases any priorly recorded signal in thermoplastic film 12 by the application of an increment of developing energy E that is substantially greater than that used during any writing step. Next, the method of the present invention includes a recording or writing step that involves subjecting thermoplastic film 12 to an electrostatic charge, to a standard optical signal that is to be recorded or written therein, and, subsequently, a predetermined increment of developing energy E. Next, a monitoring step involves monitoring both the frost intensity $F_m$ and the signal intensity $S_m$ and then plotting both the monitored frost intensity $F_m$ and the monitored signal intensity $S_m$ versus the corresponding predetermined increment of developing energy E. These erase, write, monitor cycles are repeated for predetermined, incrementally-increasing amounts of developing energy E, such as illustrated in FIG. 4, to establish the fixed relationship of the monitored signal intensity/monitored frost intensity curves as illustrated in FIG. 5. From recording system parameters the desired signal intensity $S_d$ is determined and then from the previously developed curves of FIG. 5 the related desired frost intensity $F_d$ and, accordingly, the associated developing energy $E_d$ are obtained. See FIG. 5 for an exemplary determination of the related values $S_d$, $F_d$, $E_d$.

The developing energy $E_d$, as determined from FIG. 5, is then inserted in heat controller 10 of FIG. 1. During subsequent erase/write/monitor cycles the monitored frost intensity $F_m$ is compared by frost comparator 22 to the desired frost intensity $F_d$ and if $F_m \neq F_d$ the level of the developing energy $E_d$ previously set into heat controller 10 is adjusted accordingly to provide on the next erase/write/monitor cycle $F_m = F_d$. Thus, control of the writing process to achieve consistent writing of optical data in thermoplastic film 12 is through control of the developing energy E or heat that is applied to thermoplastic film 12, all other developing parameters being held relatively constant.

Figure 6:
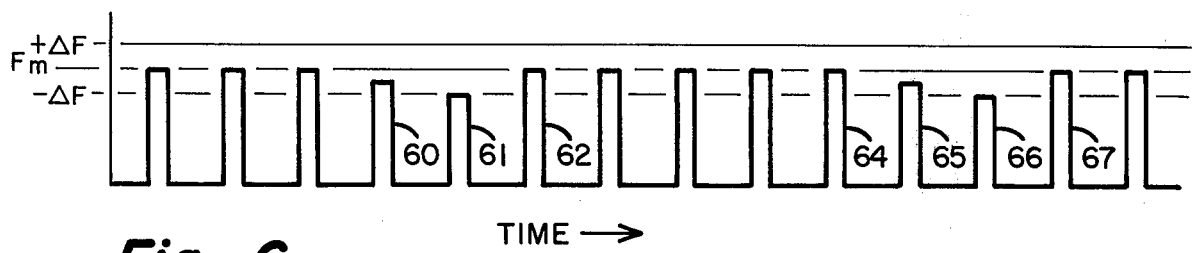
FIG. 6 is a timing diagram of the variation of the monitored frost intensity $F_m$ obtained from a typical thermoplastic film sample over several erase/write/monitor cycles.

FIG. 6 is an illustration of a timing diagram of the variation of the monitored frost intensity $F_m$ obtained from thermoplastic film 12 over several erase/write/monitor cycles. In the illustration of FIG. 6 each erase/write/monitor cycle is represented by one vertical bar with none, one, or more than one read cycle between adjacent erase/write/monitor cycles. After a plurality of erase/write/monitor cycles the monitored frost intensity $F_m$ is noted as decreasing in magnitude as at cycle 60. Frost comparator 22 determines that the monitored frost intensity $F_m$ is within the range of the predetermined monitored frost intensity $F_m \pm \Delta F$. On the next subsequent erase/write/monitor cycle, represented by bar 61, frost comparator 22 determines that the monitored frost intensity $F_m$ has fallen below the permissible range, and, accordingly, heat controller 10 is then adjusted to apply a higher level of developing energy E to thermoplastic film 12 on the next subsequent erase/write/monitor cycle. Accordingly, on the next subsequent erase/write/monitor cycle 62 the monitored frost intensity $F_m$ is determined by frost comparator 22 as being within the predetermined range. Subsequent erase/write/monitor cycles continue through erase/write/monitor cycle 64 until the monitored frost intensity $F_m$ again decreases in magnitude through erase/write/monitor cycles 65 and 66 and is reestablished at the proper lever as at erase/write/monitor cycle 67 in a manner as previously described.

Figure 7:
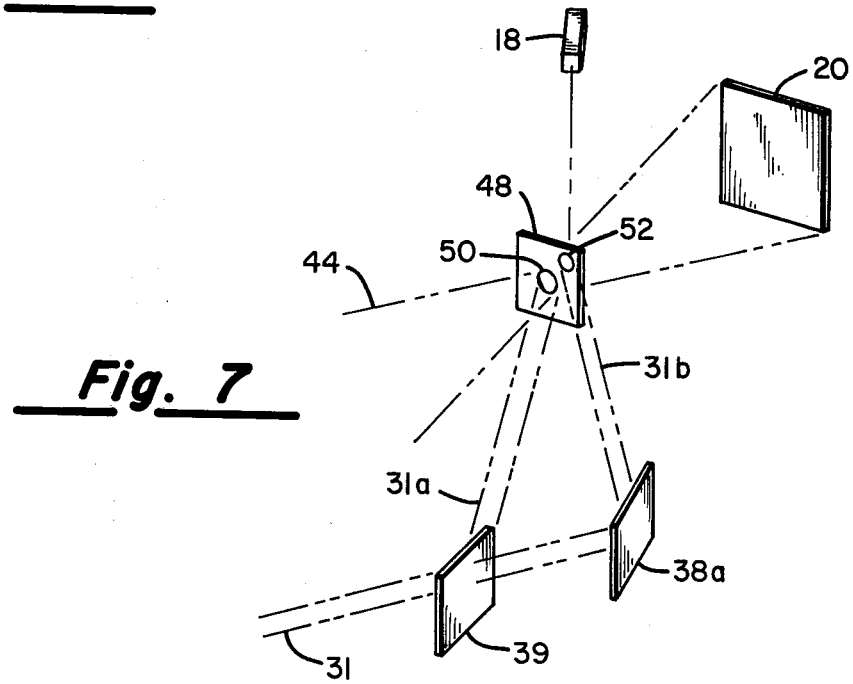
FIG. 7 is a diagrammatic illustration of a modification of the optical system of FIG. 3.

With particular reference to FIG. 7 there is presented a diagrammatic illustration of a modification of the optical system of FIG. 3. In this configuration, reference beam 31, upon impinging upon beam splitter 39, is focused only upon the recording area 50 of thermoplastic film 48. Beam splitter 39 also permits a portion of the reference beam 31 to pass therethrough, to impinge upon mirror 38a and to be focused only upon the monitoring area 52 of thermoplastic film 48. Concurrently the information bearing beam 44 is focused only upon the predetermined recording area 50 of thermoplastic film 48. Signal detector 20 is oriented along the optical axis of the information beam 44 on the far side of thermoplastic film 48 while frost detector 18 is oriented outside of the area of the signal bearing beam 44 to detect only the diffused light that is generated by the frost pattern on monitoring area 52 of thermoplastic film 48.

Figure 2:
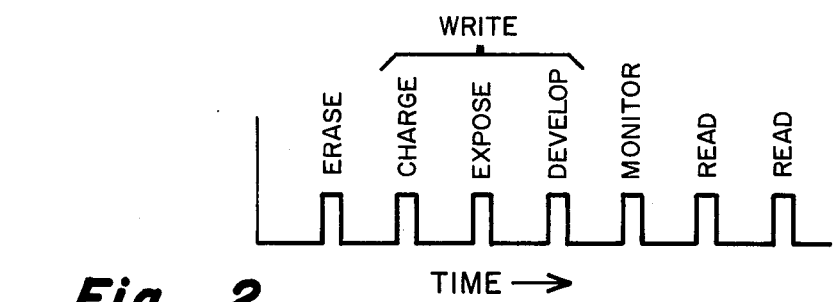
FIG. 2 is a timing diagram of the erase/write/monitor/read cycle employed by the present invention.
Figure 8:
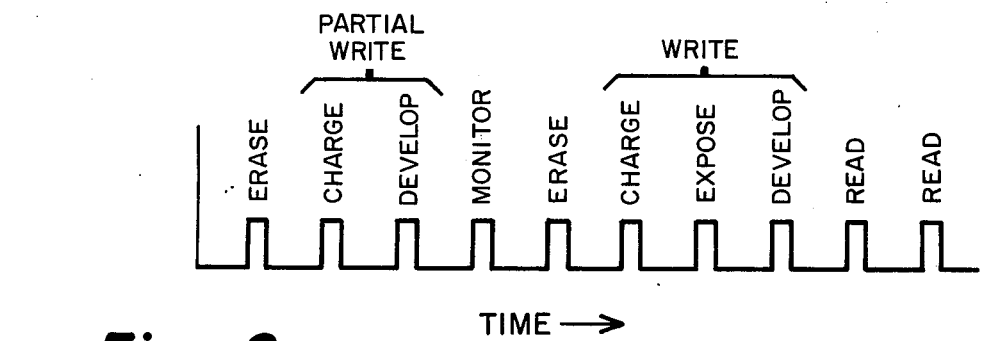
FIG. 8 is a timing diagram of an erase/partial write/monitor/erase/write/read cycle employed by the present invention as a modification of the timing diagram of FIG. 2.

With particular reference to FIG. 8 there is provided an illustration of a modification of the timing diagram of FIG. 2. For this erase/partial write/monitor/erase/write/read cycle employed by the present invention, heat controller 10 prepares the thermoplastic film 12 for the writing operation by erasing any previously written information therefrom. This erasing step consists of applying to thermoplastic film 12 an increment of developing energy E that is substantially greater than that used during any writing step. Next, this method of the present invention includes a partial writing step that involves subjecting thermoplastic film 12 to an electrostatic charge, and, subsequently, a predetermined increment of developing energy E. Next, a monitoring step involves monitoring the frost intensity $F_m$ and then plotting the monitored frost intensity $F_m$ versus the corresponding predetermined increment of developing energy E. The initial erasing step is then repeated. Next, the method of FIG. 8 includes the recording or writing step, as discussed with reference to FIG. 2, that involves subjecting thermoplastic 12 to an electrostatic charge, to a standard optical signal that is to be recorded or written therein, and, subsequently, a predetermined increment of developing energy E of the same level as used in the immediately previous partial writing step. Next, a reading (monitoring) step involves reading (monitoring) the signal intensity $S_m$ and then plotting the monitored signal intensity $S_m$ versus the corresponding predetermined increment of developing energy E. These erase/partial write/monitor/erase/write/read cycles are repeated for predetermined, incrementally-increasing amounts of developing energy E, such as illustrated in FIG. 4, to establish the fixed relationship of the monitored signal intensity/monitored frost intensity curves such as illustrated in FIG. 5. As before, from recording system parameters the desired signal intensity $S_d$ is determined and then from the previously developed curves the related desired frost intensity $F_d$ and, accordingly, the associated developing energy $E_d$ are obtained.

The developing energy $E_d$ is then inserted in heat controller 10 of FIG. 1. During such subsequent erase/partial write/monitor cycle and before the immediately following erase/write/read cycle the monitored frost intensity $F_m$ is compared by frost comparator 22 to the desired frost intensity $F_d$ and if $F_m \neq F_d$ the level of the developing energy $E_d$ previously set into heat controller 10 is adjusted accordingly. Erase/partial write/monitor cycles are repeated until on an erase/partial write/monitor cycle $F_m = F_d$. The following erase/write/read cycle is then assured to provide $S_m = S_d$. Thus, control of the writing process to achieve consistent writing of optical data in thermoplastic film 12 is, as with respect to the method of FIG. 2, through control of the developing energy E or heat that is applied to thermoplastic film 12, all other developing parameters being held relatively constant.

What is claimed is:

1. The method of achieving consistent writing of optical data in a thermoplastic film, comprising the steps of:
    a. monitoring the frost intensity $F_m$ of a thermoplastic film;
    b. comparing the monitored frost intensity $F_m$ of step (a) to an empirically determined desired frost intensity $F_d$;
    c. varying the level of the increment of developing energy E applied to the thermoplastic film during a subsequent write cycle only if the monitored frost intensity $F_m$ obtained during step (a) is not within the predetermined limits of the empirically determined desired frost intensity $F_d$.

2. The method of achieving consistent writing of optical data in a thermoplastic film, comprising the steps of:
    a. monitoring the frost intensity of $F_m$ and the signal intensity $S_m$ of a thermoplastic film for a plurality of incrementally increasing amounts of writing developing energy E;
    b. plotting the monitored frost intensity $F_m$ and the monitored signal intensity $S_m$ for each of the amounts of writing developing energy E;
    c. obtaining a desired frost intensity $F_d$ and a desired writing developing energy $E_d$ for an assured desired signal intensity $S_d$ using the curves of step (b);
    d. monitoring the frost intensity $F_m$ of said thermoplastic film due to said desired writing developing energy $E_d$ being applied to said thermoplastic film;
    e. comparing the monitored frost intensity $F_m$ of step (d) to the previously determined desired frost intensity $F_d$;
    f. varying the level of the desired writing developing energy $E_d$ applied to the thermoplastic film during a subsequent development step only if the monitored frost intensity $F_m$ obtained during step (d) is not within the predetermined limits of the previously determined desired frost intensity $F_d$.

3. The method of achieving consistent writing of optical data in a thermoplastic film, comprising the steps of:
    a. subjecting a thermoplastic film to an increment of erasing developing energy;
    b. subjecting the thermoplastic film to an electrostatic charge;
    c. subjecting the thermoplastic film to a standard optical signal and a reference beam;
    d. subjecting the thermoplastic film to an increment of writing developing energy E;
    e. subjecting the thermoplastic film to the reference beam of step (c) which reconstructs the standard optical signal of step (c) while,
        ($e_1$) monitoring the frost intensity $F_m$, and
        ($e_2$) monitoring the signal intensity $S_m$;
    f. repeating steps (a) through ($e_2$) for predetermined incrementally-increasing amounts of writing developing energy E;
    g. plotting the monitored signal intensity $S_m$ and the monitored frost intensity $F_m$ for each of the predetermined incrementally-increasing amounts of writing developing energy E of step (f);
    h. determining the desired signal intensity $S_d$ from writing system parameters;
    i. plotting the desired signal intensity $S_d$ of step (h) on the curve of the monitored signal intensity $S_m$ of step (g);
    j. obtaining the desired frost intensity $F_d$ and the desired developing energy $E_d$ corresponding to the desired signal intensity $S_d$ as plotted in step (i);
    k. repeating steps (a) through ($e_1$) for each successive erase/write/monitor cycle while changing said standard optical signal of step (d) and (e) to the specific data bearing optical signal that is to be written into the thermoplastic film at each erase/write/monitor cycle;
    l. monitoring the frost intensity $F_m$ for each of the successive erase/write/monitor cycles of step (k);
    m. comparing the monitored frost intensity $F_m$ obtained from each of the successive erase/write/monitor cycles of step (l) to the desired frost intensity $F_d$ obtained in step (j);
    n. varying the level of the increment of writing developing energy E of step (d) while performing step (k) during the next subsequent erase/write/monitor cycle of step (k) only if the monitored frost intensity $F_m$ obtained during the next previous erase/write/monitor cycle of step (k) is not within the predetermined limits of the desired frost intensity $F_d$ obtained during step (j).

4. The method of achieving consistent writing of optical data in a thermoplastic film, comprising the steps of:
    a. subjecting a thermoplastic film to an increment of erasing developing energy;

b. subjecting the thermoplastic film to an electrostatic charge;
c. subjecting the thermoplastic film to an increment of writing developing energy E;
d. subjecting the thermoplastic film to a reference beam while,
   $d_1$. monitoring the frost intensity $F_m$;
e. subjecting the thermoplastic film to an increment of erasing developing energy;
f. subjecting the thermoplastic film to an electrostatic charge;
g. subjecting the thermoplastic film to a standard optical signal and the reference beam of step (d);
h. subjecting the thermoplastic film to an increment of writing developing energy E;
i. subjecting the thermoplastic film to the reference beam of step (d) which reconstructs the standard optical signal of step (g) while,
   $i_1$, monitoring the signal intensity $S_m$;
j. repeating steps (a) through (i) for predetermined incrementally-increasing amounts of writing developing energy E;
k. plotting the monitored signal intensity $S_m$ and the monitored frost intensity $F_m$ for each of the predetermined incrementally-increasing amounts of writing developing energy E of step (j);
l. determining the desired signal intensity $S_d$ from writing system parameters;
m. plotting the desired signal intensity $S_d$ of step (l) on the curve of the monitored signal intensity $S_m$ of step (k);
n. obtaining the desired frost intensity $F_d$ and the desired developing energy $E_d$ corresponding to the desired signal intensity $S_d$ as plotted in step (k);
o. repeating steps (e) through ($i_1$) for each of a plurality of successive erase/partial write/monitor/erase/write/read cycles while changing said standard optical signal of steps (g) and (i) to the specific data bearing optical signal that is to be written into the thermoplastic film at each of the write steps;
p. monitoring the frost intensity $F_m$ at each of the monitor steps of step (o),
q. comparing the monitored frost intensity $F_m$ obtained from each of the monitor steps of step (o) to the desired frost intensity $F_d$ obtained in step (n);
r. omitting the following erase/write/read cycle if the monitored frost intensity $F_m$ obtained during the previous monitor step of step (o) is not within the predetermined limits of the desired frost intensity $F_d$;
s. varying the level of the increment of writing developing energy E of step (c) during the next following successive erase/partial write/monitor cycles of steps (a), (b), (c), (d) until the monitored frost intensity $F_m$ is within the predetermined limits of the desired frost intensity $F_d$;
t. performing an erase/write/read cycle of steps (e), (f), (g), (h) while changing said standard optical signal of step (g) to the specific data bearing optical signal that is to be written into the thermoplastic film.

* * * * *